US012699147B2

(12) United States Patent
Shao et al.

(10) Patent No.: US 12,699,147 B2
(45) Date of Patent: Aug. 4, 2026

(54) SYSTEMS AND METHODS FOR BATTERY HEALTH PREDICTION WITH ON-DEVICE LEARNING

(71) Applicant: Samsung Electronics Company, Ltd., Suwon si (KR)

(72) Inventors: Zijing Shao, Toronto (CA); Davinder Pal Singh, Coquitlam (CA)

(73) Assignee: Samsung Electronics Company, Ltd., Suwon City (KR)

( * ) Notice: Subject to any disclaimer, the term of this patent is extended or adjusted under 35 U.S.C. 154(b) by 584 days.

(21) Appl. No.: 18/069,037

(22) Filed: Dec. 20, 2022

(65) Prior Publication Data

US 2024/0201275 A1     Jun. 20, 2024

(51) Int. Cl.
G01R 31/392     (2019.01)
G01R 31/367     (2019.01)

(52) U.S. Cl.
CPC ......... G01R 31/392 (2019.01); G01R 31/367 (2019.01)

(58) Field of Classification Search
CPC ........................... G01R 31/392; G01R 31/367
See application file for complete search history.

(56) References Cited

U.S. PATENT DOCUMENTS

| | | | |
|---|---|---|---|
| 6,456,988 | B1 | 9/2002 | Singh |
| 9,715,660 | B2 | 7/2017 | Parada San Martin |
| 10,300,798 | B2 | 5/2019 | Paryani |
| 11,201,361 | B2 | 12/2021 | Clarke |
| 2017/0024641 | A1 | 1/2017 | Wierzynski |
| 2018/0143257 | A1* | 5/2018 | Garcia ................. G01R 31/382 |

(Continued)

FOREIGN PATENT DOCUMENTS

| | | |
|---|---|---|
| CN | 102798823 A | 11/2012 |
| CN | 103308864 B | 6/2015 |

(Continued)

OTHER PUBLICATIONS

Naha, A., Han, S., Agarwal, S. et al. An Incremental Voltage Difference Based Technique for Online State of Health Estimation of Li-ion Batteries. Sci Rep 10, 9526 (2020). https://doi.org/10.1038/s41598-020-66424-9, Jun. 12, 2020.

*Primary Examiner* — Lal Ce Mang

(74) *Attorney, Agent, or Firm* — Baker Botts L.L.P.

(57)                ABSTRACT

In one embodiment, a method includes accessing, from a remote server, a general battery-heath model corresponding to a mobile electronic device to calculate a state-of-health value for a battery of the mobile electronic device. The method may access real-time multiple data subgroups of battery charging data from the mobile electronic device for multiple battery charging modes and battery degradation trends. The method may train, using the general battery-health model as a starting model, a customized battery-health model in a cascaded workflow using each of the battery charging data subgroups. The customized battery-health model is a deep neural network trained to calculate state-of-health for the mobile electronic device for the multiple battery charging modes, respectively. The method may determine, using the customized battery-health model, state-of-health values for the mobile electronic device based on real-time battery output capacity, real-time battery output voltage, real-time battery output current, and real-time battery charging mode.

20 Claims, 7 Drawing Sheets

(56) References Cited

U.S. PATENT DOCUMENTS

| 2021/0028511 | A1 * | 1/2021 | Clarke | ................ | H02J 7/00714 |
| 2022/0065939 | A1 * | 3/2022 | Senn | ..................... | G06N 3/088 |
| 2022/0229121 | A1 * | 7/2022 | Fan | ........................ | B60L 3/12 |
| 2022/0334191 | A1 * | 10/2022 | Simonis | .............. | G01R 31/367 |

FOREIGN PATENT DOCUMENTS

| CN | 105823988 | B | | 8/2019 | | |
| CN | 112488444 | A | * | 3/2021 | .............. | B60L 53/60 |
| JP | 2004279607 | A | * | 10/2004 | ............. | Y02E 60/10 |
| WO | WO-2020115761 | A1 | * | 6/2020 | .............. | H04Q 9/00 |

* cited by examiner

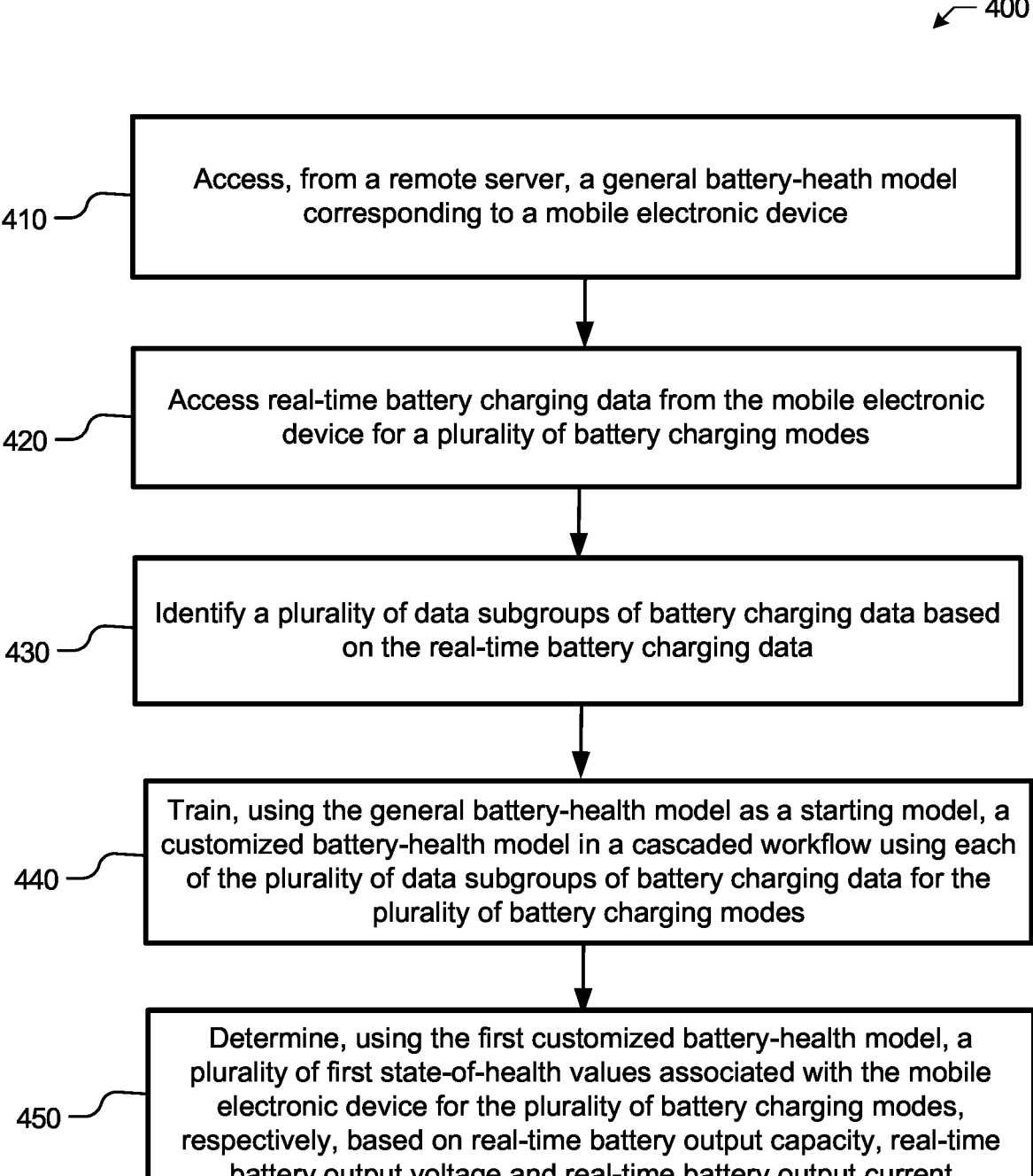

400

410 — Access, from a remote server, a general battery-heath model corresponding to a mobile electronic device 420 — Access real-time battery charging data from the mobile electronic device for a plurality of battery charging modes 430 — Identify a plurality of data subgroups of battery charging data based on the real-time battery charging data 440 — Train, using the general battery-health model as a starting model, a customized battery-health model in a cascaded workflow using each of the plurality of data subgroups of battery charging data for the plurality of battery charging modes 450 — Determine, using the first customized battery-health model, a plurality of first state-of-health values associated with the mobile electronic device for the plurality of battery charging modes, respectively, based on real-time battery output capacity, real-time battery output voltage and real-time battery output current

*FIG. 4*

SYSTEMS AND METHODS FOR BATTERY HEALTH PREDICTION WITH ON-DEVICE LEARNING

TECHNICAL FIELD

This disclosure relates generally to database and file management within network environments, and in particular relates to battery management systems and battery State-of-Health predictions using off-device training and on-device learning.

BACKGROUND

With the rapid evolution of electrified transportation and smart grid, the lithium-ion (Li-ion) batteries are one of the leading energy storage sources due to high energy density, low cost, low self discharge rate, and long lifetime. The development of replaceable lithium-ion batteries and battery management systems are necessary to protect batteries from damage, prolong battery life, and operate safely. State of health (SoH) is an important indicator for assessing the usability and capabilities of a battery system of an electronic device. The SoH value is defined by both the available charge capacity of the battery and the maximum power available from the battery. Thus, the SoH value is a dynamic battery status metric that compares the available capacity to the initial condition, which tends to diminish over time as battery ages due to chemical composition and deterioration. As example and not by way of limitation, a user may use the SoH value of a battery system to interpret that the battery is close to the end of its cycle life and needs replacement. Another interpretation of the SoH value is the capability of the battery system to meet its load demand. As example and not by way of limitation, the SoH value can be used to predict impending battery failure in battery powered electronic devices. Thus, the ability to predict the SoH value of the battery system accurately and directly on device is critical for prompt maintenance and replacement. Accordingly, the SoH value can be used to ultimately construct optimal energy management strategies and efficient battery operations.

BRIEF DESCRIPTION OF THE DRAWINGS

FIG. 4 illustrates a flow diagram of a method for training a deep learning model to characterize degradation pattern of battery capacity for a plurality of battery charging modes.

DESCRIPTION OF EXAMPLE EMBODIMENTS

Mobile Client System Overview

Figure 1:
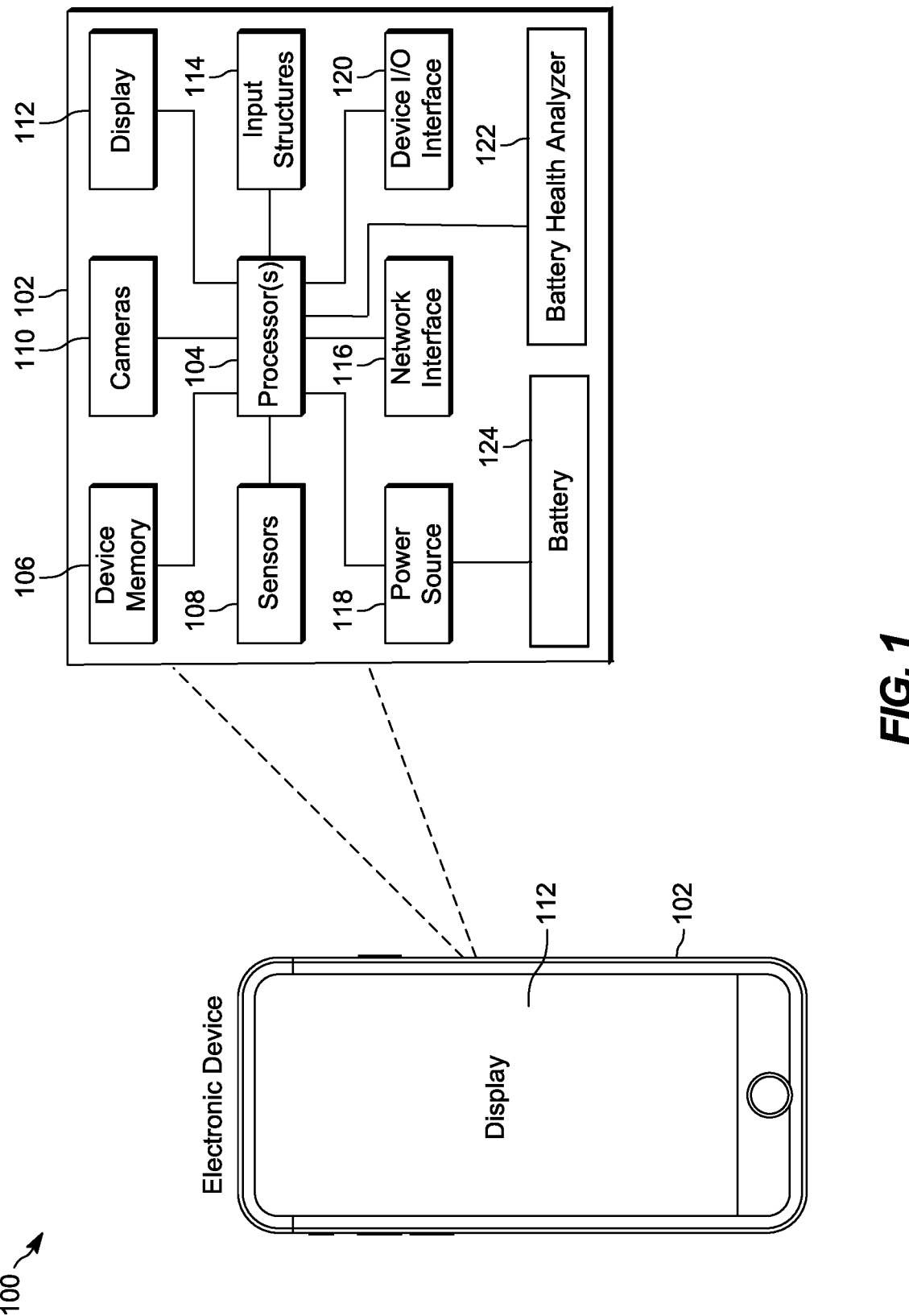
FIG. 1 illustrates an example electronic device of a user.

FIG. 1 illustrates an example electronic device 100 of a user. In particular embodiments, the electronic device 100 may include, for example, any of various personal mobile electronic devices 102, such as a mobile phone electronic device, an electric car, a tablet computer electronic device, a laptop computer electronic device, and so forth. In particular embodiments, as further depicted by FIG. 1, the personal electronic device 102 may include, among other things, one or more processor(s) 104, device memory 106, sensors 108, cameras 110, a display 112, input structures 114, network interfaces 116, a power source 118, a battery 124, a device input/output (I/O) interface 120, and a battery health analyzer 122. It should be noted that FIG. 1 is merely one example of a particular implementation and is intended to illustrate the types of components that may be included as part of the electronic device 100.

In particular embodiments, the one or more processor(s) 104 may be operably coupled with the device memory 106 to perform various algorithms, processes, or functions. Such programs or instructions executed by the processor(s) 104 may be stored in any suitable article of manufacture that includes one or more tangible, computer-readable media at least collectively storing the instructions or routines, such as the device memory 106. The device memory 106 may include any suitable articles of manufacture for storing data and executable instructions, such as random-access memory (RAM), read-only memory (ROM), rewritable flash memory, hard drives, and so forth. Also, programs (e.g., an operating system) encoded on such a computer program product may also include instructions that may be executed by the processor(s) 104 to enable the electronic device 100 to provide various functionalities.

In particular embodiments, the sensors 108 may include, as example and not by way of limitation, one or more cameras (e.g., depth cameras), touch sensors, microphones, motion detection sensors, thermal detection sensors, light detection sensors, time of flight (ToF) sensors, ultrasonic sensors, infrared sensors, or other similar sensors that may be utilized to detect various user inputs (e.g., user voice inputs, user gesture inputs, user touch inputs, user instrument inputs, user motion inputs, and so forth). The cameras 110 may include any number of cameras (e.g., wide cameras, narrow cameras, telephoto cameras, ultra-wide cameras, depth cameras, and so forth) that may be utilized to capture various 2D and 3D images. The display 112 may include any display architecture (e.g., AMLCD, AMOLED, micro-LED, and so forth), which may provide further means by which a user may interact and engage with the electronic device 100. In particular embodiments, as further illustrated by FIG. 1, one more of the cameras 110 may be disposed behind, underneath, or alongside the display 112 (e.g., one or more of the cameras 110 may be partially or completely concealed by the display 112), and thus the display 112 may include a transparent pixel region and/or semi-transparent pixel region through which the one or more concealed cameras 110 may detect light, and, by extension, capture images. It should be appreciated that the one more of the cameras 110 may be disposed anywhere behind or underneath the display 112, such as at a center area behind the display 112, at an upper area behind the display 112, or at a lower area behind the display 112.

In particular embodiments, the input structures 114 may include any physical structures utilized to control one or more global functions of the electronic device 100 (e.g., pressing a button to power "ON" or power "OFF" the electronic device 100). The network interface 116 may include, as example and not by way of limitation, any number of network interfaces suitable for allowing the electronic device 100 to access and receive data over one or more cloud-based networks (e.g., a cloud-based service that may service hundreds or thousands of the electronic device 100 and the associated users corresponding thereto) and/or distributed networks. The power source 118 may include any suitable source of power, such as an alternating current (AC) power converter that may be utilized to power and/or charge the electronic device 100 for operation. The battery 124 may include a battery system, such as a battery cell or a battery pack, coupled to the power source 118. In particular, the battery 124 may include a rechargeable lithium polymer (Li-poly) battery or a lithium-ion battery. Similarly, the device I/O interface 120 may be provided to allow the electronic device 100 to interface with various other electronic or computing devices, such as one or more auxiliary electronic devices.

In particular embodiments, the battery health analyzer 122 may be programmed to predict a plurality of state-of-health (SoH) values associated with the electronic device 100 based on a customized battery-health model. SoH is a dynamic battery status metric that compares an available capacity $C_{usable}$ to an initial condition $C_{initial}$ of the battery associated with the electronic device 100 based on Equation 1. The SoH value tends to diminish over time as the battery of the electronic device 100 ages due to chemical composition and deterioration. The ability to predict the SoH value of the battery 124 accurately and directly on device is critical for prompt maintenance and replacement. The battery health analyzer 122 may access, from a remote server, a general battery-health model, which is a generic model for different types of electronic devices, via the network interface 116. In particular, the general battery-health model can be trained using a machine learning (ML) algorithm on cloud based on historic battery output capacity, historic battery output voltage, and historic battery output current associated with the electronic device 100. As an example and not by way of limitation, the general battery-health model may be trained by a supervised machine learning algorithm, such as a generic Deep Neural Network (DNN), which can understand a plurality of battery characteristics, such as degradation patterns of battery capacity. As another example and not by way of limitation, the knowledge of the general battery-health model, such as model weights, may be transmitted to the electronic device 100 via the network interface 116.

In particular embodiments, the battery health analyzer 122 may apply on-device training using a cascaded workflow to generate a customized battery-health model using the general battery-health model as a starting model. As an example and not by way of limitation, the customized battery-health model may be trained by using a deep neural network and a plurality of data subgroups of battery charging data for a plurality of battery charging modes. In particular, the personal electronic device 102 may support a battery fast charging mode and/or a battery slow charging mode. The battery charging mode is defined based on the capacity recovery rate when the battery charging mode is applied. Specifically, the battery health analyzer 122 may apply continuous transfer learning on the electronic device 100, by transferring the model weights of the customized battery-health model for a previous battery charging cycle, and updating the model weights of the customized battery-health model based on battery charging data for current battery charging cycle. As a result, the battery health analyzer 122 may use the customized battery-health model to determine device specific battery characteristics, such as state-of-health values associated with the electronic device 100 for the plurality of battery charging modes, respectively. The battery health analyzer 122 may assess the determined device specific battery characteristics to identify abnormal patterns due to charging modes and make personalized recommendations on battery replacement or impairment.

$$SoH = \frac{C_{usable}}{C_{initial}} \qquad \text{Equation 1}$$

where $C_{usable}$ is the usable capacity which represents the maximal releasable capacity when it completely discharged, while $C_{initial}$ is the initial capacity provided by the manufacturer.

Machine-Learning System Overview

Figure 2:
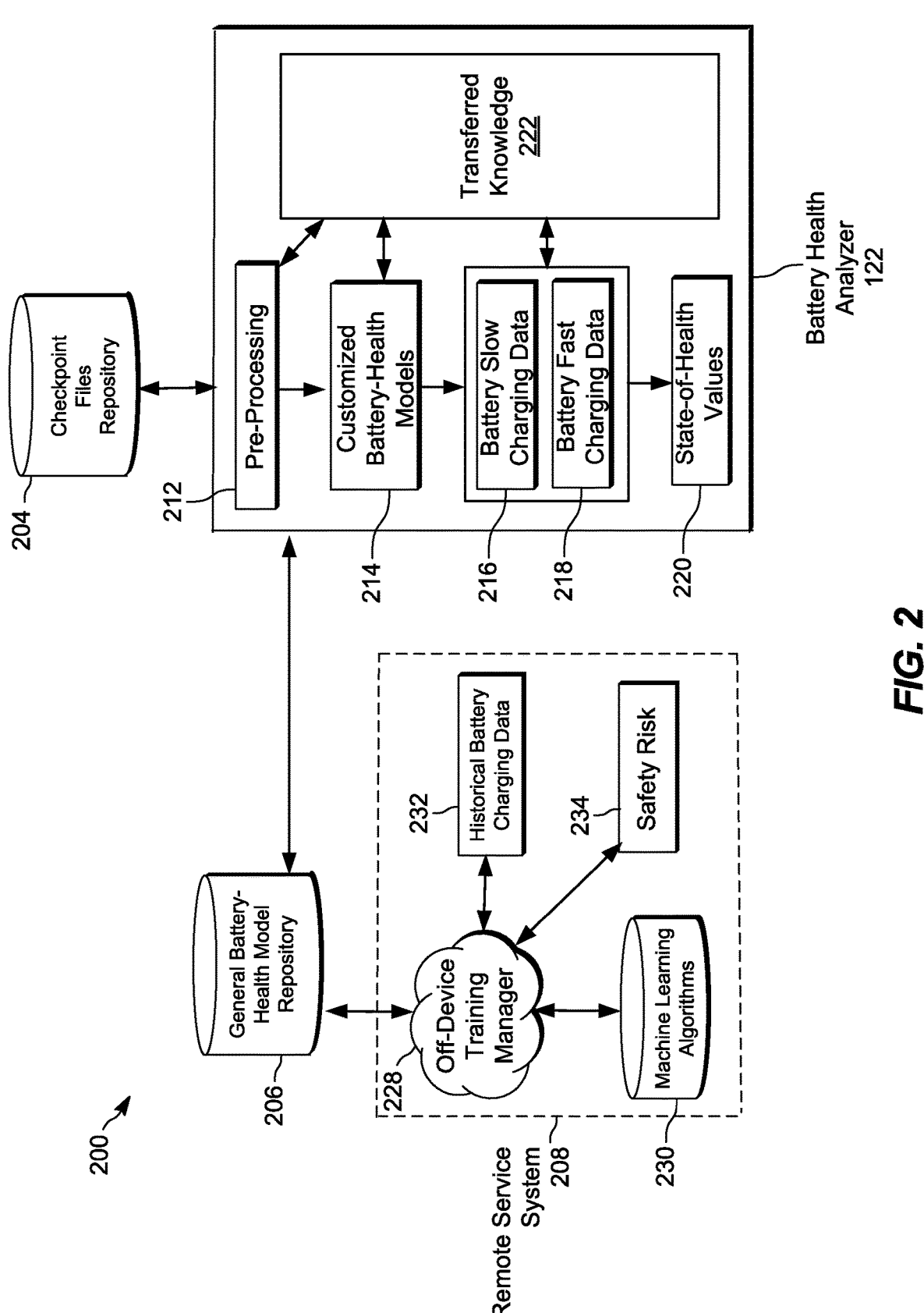
FIG. 2 illustrates an example prediction system.

FIG. 2 illustrates an example prediction system 200. As depicted by FIG. 2, the prediction system 200 may include a remote service system 208, a battery health analyzer 122, and one or more databases, such as a checkpoint files repository 204 and a general battery-health model repository 206. In particular embodiments, the remote service system 208 may include an off-device training manager 228 to generate a general battery-health model for all batteries on cloud that can understand the characteristics, such as degradation patterns of battery capacity and safety risk 234. The generic DNN model may be a centralized model trained using one or more machine learning algorithms 230 based on centralized data, such as historical battery charging data 232. In particular embodiments, the prediction system 200 may store knowledge of general battery-health model in a database, such as a general battery-health model repository 206. Specifically, the knowledge of the general battery-health model may include a plurality of weights of the model. In particular embodiments, the prediction system 200 may transfer the knowledge of the general battery-health model to a target device, such as the battery health analyzer 122 of the electronic device 100. Additionally, the battery health analyzer 122 may provide automatic SoH estimation based on the electronic device 100 extended from cloud. The determined automatic SoH estimation may be necessary for battery management systems to protect the battery system of the electronic device 100 from damage, prolong battery life, and operate safely.

In particular embodiments, the remote service system 208 may include a cloud-based cluster computing architecture or other similar computing architecture, such as off-device training manager 228, that may use the one or more machine learning algorithms 230 to determine the general battery-health model to characterize degradation pattern of battery capacity based on historical battery charging data 232. The general battery-health model allows using a shared initial global model as base initialization for a variety of device types to reduce the cost of labelled data. The initial global model may a pre-trained model in the general battery-health model repository 206 exported from cloud during the off-device trainings. The initial global model can be dispatched to mobile devices upon a request from the battery health analyzer 122. If a pre-trained model already exists in the general battery-health model repository 206, the off-device training manager 228 may update the general battery-health model based on the historical charging data 232 which includes historic battery output capacity, historic battery output voltage, and historic battery output current associated with the electronic device 100. Additionally, the remote service system 208 may collect large and centralized data to build models for a user's electronic device other than smartphones, such as electric vehicles and electric bikes, equipped with a battery system. The remote service system 208 may transfer data to the electronic device 100 via the I/O interface to enable a non-connected electronic device 100 to apply on-device learning to determine a customized battery-health model to characterize degradation pattern of battery capacity by using the electronic device 100. Additionally, in particular embodiments, the remote service system 208 may be utilized to manage and store the general battery-health model in the general battery-health model repository 206 using a Platform as a Service (PaaS) architecture, a Software as a Service (SaaS) architecture, and an Infrastructure as a Service (IaaS), or other various cloud-based cluster computing architectures.

In particular embodiments, as further depicted by FIG. 2, the battery health analyzer 122 may include a pre-processing functional block 212, a customized battery-health models functional block 214, a battery slow charging data functional block 216, a battery fast charging data functional block 218, a State-of-Health values functional block 220, and a transferred knowledge functional block 222. In particular embodiments, the battery health analyzer 122 may be coupled to the one or more processors 104 associated with the electronic device 100. In particular embodiments, the battery health analyzer 122 may apply transfer learning to enable a plurality of model weights of the general battery-health model used as transferred knowledge on the electronic device 100. In particular embodiments, the battery health analyzer 122 may transfer other knowledge data of the electronic device 100, such as model weights, battery charging data, safety risks, and SoH values, to the remote service system 208.

In particular embodiments, the pre-processing functional block 212 may process the data and battery-health model for improving efficiency of machine learning for automatic SoH estimation. As an example and not by way of limitation, the pre-processing functional block 212 may receive input data from the electronic device 100 and the remote service system 208, such as real-time battery charging data for a plurality of charging modes associated with the electronic device 100 and the knowledge of the general battery-health model from the remote service system 208. The pre-processing functional block 212 may remove abnormal and missing values in the received input data. Specifically, the battery slow and fast charging data may include a plurality of model parameters, such as battery voltage, battery current, battery temperature, relative state of charge (SOC), etc. The pre-processing functional block 212 may calculate relative state of charge (SOC) and transform the input time-domain data into SOC-domain data which is correlated with usable capacity. The pre-processing functional block 212 may manage and store a plurality of data subgroups of the received battery slow charging data 216 and battery fast charging data 218. The pre-processing functional block 212 may apply a correlation analysis to identify a plurality of data subgroups of battery charging data based on the real-time battery charging data. Each data subgroup is associated with one of the battery charging modes, such as a battery slow charging mode and/or a battery fast charging mode. As an example and not by way of limitation, the real-time battery charging data has a first sampling rate of the battery fast charging mode and/or a second sampling rate of the battery slow charging mode. The first sample rate is at a higher frequency than the second sampling rate. The pre-processing functional block 212 may apply over-sampling to the real-time battery charging data for the battery slow charging mode to match a sampling rate of the battery charging data for the battery fast charging mode.

In particular embodiments, the customized battery-health models functional block 214 may include one or more deep neural networks used to calculate SoH values 220 associated with the electronic device 100 for a plurality of battery charging modes, respectively, based on real-time battery output capacity, real-time battery output voltage, and real-time battery output current. The customized battery-health model 214 may be trained by the machine learning algorithms 230 from the remote service system 208. Likewise, the customized battery-health model 214 may be trained using a deep neural network, such as feedforward neural networks (FNNs), convolutional neural networks (CNNs), and long short-term memory (LSTM), chosen by the user of the electronic device 100. As an example and not by way of limitation, the battery health analyzer 122 may apply a model-based machine learning method by modeling the battery and considering the internal degradation process to estimate SoH values 220 of the battery system associated with the electronic device 100 for a plurality of battery charging modes. In particular, the customized battery-health model 214 may include charging modes as input model parameters because the charging modes affect some battery charging parameters, such as battery output capacity, battery output voltage, battery output current, and the values of feature vectors which indicate incremental internal impedance. The customized battery-health model 214 may achieve improved prediction accuracy than the general battery-health model which suffers from an underfitting issue. The underfitting issue is caused by the difference of the battery charging parameters between different battery charging modes. Because different battery charging data shows different patterns between different battery charging modes, the general battery-health model treats some abnormal charging data as outliers. Because of an improved model parameterization scheme, the customized battery-health model 214 may overcome the underfitting issue to improve SoH prediction accuracy for the plurality of battery charging modes.

In particular embodiments, the battery health analyzer 122 may be programmed to use a cascaded workflow to determine the customized battery-health models 214 based on battery charging data for a plurality of battery charging modes, such as the battery slow charging data 216 and the battery fast charging data 218. The customized battery-health model 214 may be trained using the plurality of data subgroups of battery charging data based on the real-time battery charging data. As an example and not by way of limitation, the customized battery-health model 214 may be firstly updated using a first cycle battery charging data which includes the battery slow charging data 216. The updated customized battery-health model 214 may then serve as transferred knowledge 222 for next training using second cycle battery charging data which includes the battery fast charging data 218. As another example and not by way of limitation, the customized battery-health model 214 may be firstly updated using a first cycle battery charging data which includes the battery fast charging data 218. The updated customized battery-health model 214 may then serve as transferred knowledge 222 for next training using second cycle battery charging data which includes the battery slow charging data 216. In particular, the battery health analyzer 122 may identify the plurality of battery charging modes for training the customized battery-health model based on a predetermined criterion defined by the user. Each time the customized battery-health model 214 is updated for one of the plurality of battery charging modes, the battery health analyzer 122 may store the model weights of the customized battery-health model 214 in a database, such as transferred knowledge 222. Likewise, the battery health analyzer 122 may also store the model weights of the customized battery-health model 214 in checkpoint files from a checkpoint files repository 204 when the customized battery-health model 214 needs to be stored for back-up or maintenance in the future.

In particular embodiments, the battery health analyzer 122 may apply on-device training with transferred knowledge from previous model which is triggered by a fully charged battery. As an example and not by way of limitation, each time the battery is fully charged, it can trigger on-device training with transferred knowledge from a previous customized battery-health model. The battery health analyzer 122 may load the previous customized battery-health model from the checkpoint files repository 204 or the transferred knowledge database 222. The battery health analyzer 122 may use the previous customized battery-health model as a starting model to update the customized battery-health model for the next cycle. The battery health analyzer 122 may provide stable SoH estimation based on several sequential trainings when the battery of the electronic device 100 is initially used with SoH close to 100. The several sequential training may take into consideration for a plurality of charging modes available to the electronic device 100 for the user. As a result, the battery health analyzer 122 may efficiently determine a final customized battery-health model at very low computation cost. The final customized battery-health model can be standalone and independent of other SoH prediction algorithms for automatic device-specific SoH prediction based on incremental impendence of battery. The battery health analyzer 122 may apply continuous learning on device to increase model accuracy for the customized battery-health model 214 by dynamically adjusting model parameters beneficial to unique battery characteristics of the battery system of the electronic device 100. In particular, the battery health analyzer 122 may require much less resources and computational power because the on-device model predictions are determined for the device-specific battery charging data which is usually much smaller in size compared to historical battery charging data 232. There are low latency and no privacy issues for the automatic device-specific SoH prediction based on the final customized battery-health model.

In particular embodiments, the battery health analyzer 122 may use the automatic SoH prediction on device to inform battery life status. In particular, the battery health analyzer 122 may determine abnormal patterns of the plurality of SoH values of the battery system associated with the electronic device 100 for the plurality of battery charging modes. The battery health analyzer 122 may identify abnormal batteries and reduce safety risks which can be used to alleviate unexpected device shutoffs and schedule battery replacement or repairment. In particular embodiments, the battery health analyzer 122 can be applied to determine automatic SoH prediction for other battery powered products, such as smartphones, electric vehicles, etc.

Off-Device Training and On-Device Training

Figure 3:
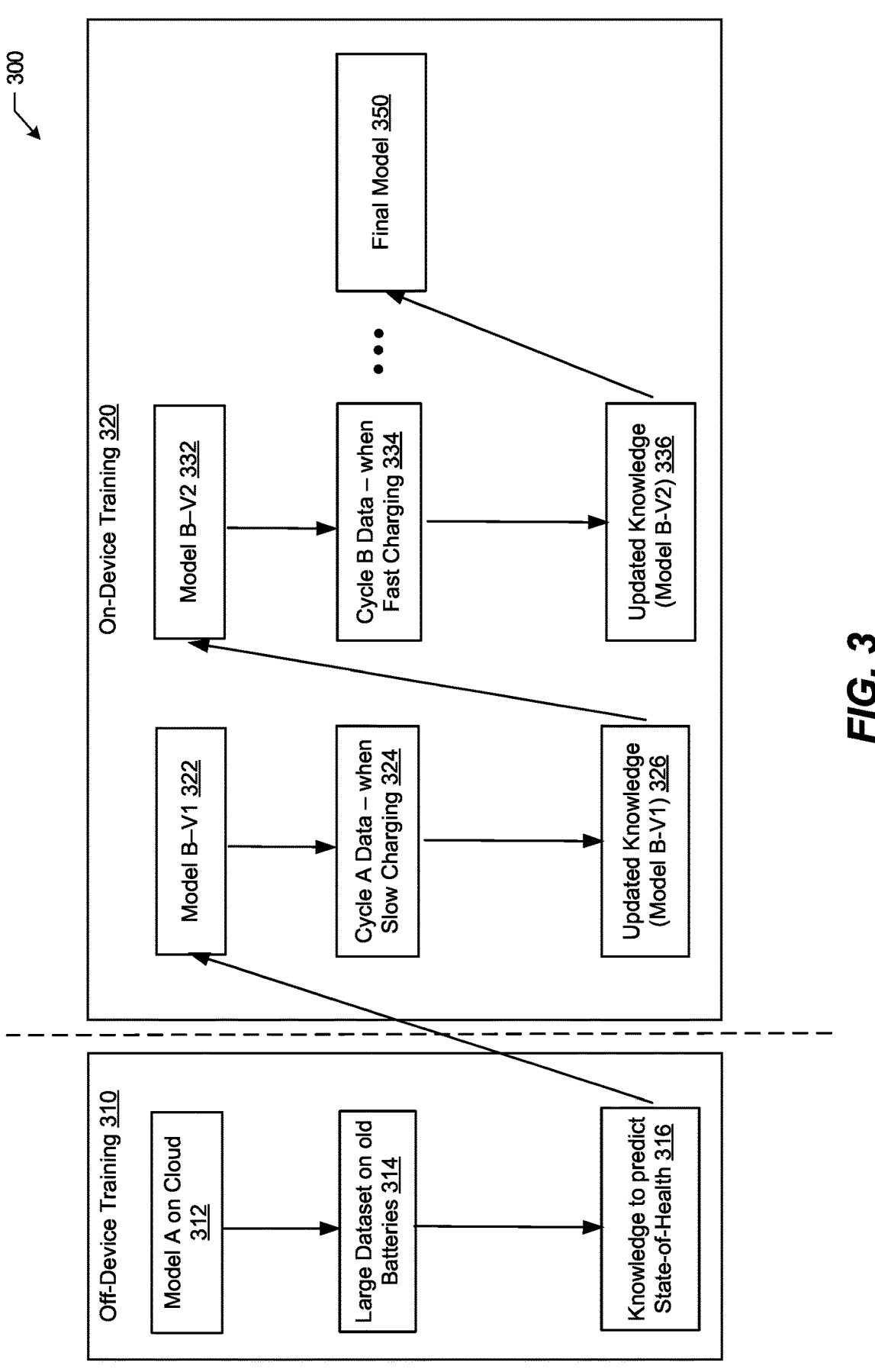
FIG. 3 illustrates an example system that may be utilized to perform off-device training and on-device training for the electronic device.

FIG. 3 illustrates an example system 300 that may be utilized to perform off-device training 310 and on-device training 320 for the electronic device 100. In particular embodiments, the off-device training manager 228 may generate an initial model for on-device training, such as model A on Cloud 312, during the off-device training 310 process. In particular embodiments, the battery health analyzer 122 may use the initial model as a starting model and generate a customized battery-health model, such as final model 350, for automatic SoH prediction for a battery system of an electronic device. As used herein, "an electronic device" may refer to an electronic device equipped with a battery system. As an example and not by way of limitation, the battery system may be equipped with any suitable source of power, such as a rechargeable lithium polymer (Li-poly) battery, a lithium-ion battery. As another example and not by way of limitation, the electronic device may be a smartphone, an electric vehicle, or an electric bike. Although this disclosure describes the battery system of the electronic device in a particular manner, this disclosure contemplates the battery system of the electronic device in any suitable manner.

Certain embodiments disclosed herein may provide one or more technical advantages. A technical advantage of the embodiments may include continuous learning on device to increase battery-health model accuracy by dynamically adjusting to this battery on-device. Another technical advantage of the embodiments may include reducing resources and less computation power with no privacy issues for automatic on-device SoH prediction with low latency. Certain embodiments disclosed herein may provide none, some, or all of the above technical advantages. One or more other technical advantages may be readily apparent to one skilled in the art in view of the figures, descriptions, and claims of the present disclosure.

In particular embodiments, the off-device training manager 228 may generate an initial model for on-device training, such as model A on cloud 312, during the off-device training 310 process. The initial model can be a general battery-health model for a particular battery type, such as lithium-ion battery, for all electronic devices. Specifically, the initial model may be trained on cloud using a deep neural network to calculate a state-of-health value for a battery of the electronic device based on historic battery output capacity, historic battery output voltage, and historic battery output current associated with the electronic device, such as large dataset on old batteries 314. Because the off-device DNN training 310 can be considered as reasonable initialization, the model A on Cloud 312 can be used as a proper starting model during the on-device training process 320 to be exported from cloud and dispatched as knowledge to predict SoH 316 to an electronic device, such as a smartphone, of a user.

In particular embodiments, the battery health analyzer 122 may load the initial model from cloud as transferred knowledge for a starting model to determine a customized battery-health model for the battery system of the electronic device. The battery health analyzer 122 may access real-time battery charging data from the electronic device for a plurality of battery charging modes. Specifically, the real-time battery charging data includes battery input voltage and battery input current during each of the plurality of battery charging modes. The battery health analyzer 122 may identify a plurality of data subgroups of battery charging data based on the real-time battery charging data from different cycles. Each data subgroup is associated with one of the battery charging modes. As an example and not by way of limitation, the on-device training process 320 may determine the customized battery-health model using two cycle data for two different battery charging modes, such as cycle A data when slow charging 324 and cycle B when fast charging 334.

In particular embodiments, the battery health analyzer 122 may determine the customized battery-health model in a cascaded workflow using each of the plurality of data subgroups of battery charging data for the plurality of battery charging modes and battery degradation patterns/speeds. In particular, the customized battery-health model is a deep neural network trained to calculate SoH values associated with the electronic device for the plurality of battery charging modes, respectively. As an example and not by way of limitation, the battery health analyzer 122 may firstly update the customized battery-health model, such as model B-V1 322 using the first cycle data, such as cycle A data when slow charging 324. The battery health analyzer 122 may use the updated customized battery-health model, such as model B-V1 322, as updated knowledge (model B-V1) 326 for next training using second cycle data, such as cycle B when fast charging 334.

In particular embodiments, the battery health analyzer 122 may assess the transferred knowledge from the first cycle to secondly update the customized battery-health model, such as model B-V2 332 using the second cycle data, such as cycle B data when fast charging 334. The battery health analyzer 122 may use the updated customized battery-health model as updated knowledge (model B-V2) 336 for next training until the final model 350 is ready for operation. The battery health analyzer 122 may enable stable SoH estimation based on a few sequential trainings when battery is initially used with SoH close to 100 as shown in Table 1 and Table 2. As a result, the battery health analyzer 122 can achieve an improve accuracy of 95% for the automatic SoH estimation based on both the off-device training using a general battery-health model and the on-device training using a customized battery-health model compared to the off-device training using the general battery-health model. As an example and not by way of limitation, the battery health analyzer 122 may apply the office-device training and on-device training to estimate prediction error of SoH values for two different electronic devices, such as device A or device B: the automatic SoH estimation has a prediction error of 3.52% or 6.59% for the off-device training using model A on Cloud 312, a prediction error of 0.57% or 0.54% after the first cycle on-device training using model B-V1 322, a prediction error of 0.86% or 0.08% after the second cycle on-device training using model B - V2 332, and a prediction error of 0.55% or 0.08% for the final model 350. An example of on-device battery SoH training and prediction error may be found in Table 1 below.

TABLE 1

| Device\Prediction Error | Off-device Training (Model A) | 1$^{st}$ Cycle (Model B-V1) | 2$^{nd}$ Cycle (Model B-V2) | Final model |
|---|---|---|---|---|
| Device A | 3.52% | 0.57% | 0.86% | 0.55% |
| Device B | 6.59% | 0.54% | 0.08% | 0.08% |

On-device battery SoH training and prediction error

In addition, the battery health analyzer 122 may apply the office-device training and on-device training to estimate prediction accuracy of SoH values for three different electronic devices, such as device C or device D, and device E. An example of on-device battery SoH training and prediction accuracy may be found in Table 2 below.

TABLE 2

On-device battery SoH training and prediction accuracy

| Device Name | Actual SoH | Prediction before Training | Prediction after Training Cycle 1 | Prediction after Training Cycle 2 | Prediction after Training Cycle 3 |
|---|---|---|---|---|---|
| Device C | 95.14 | 98.49 | 95.68 | 95.96 | 95.67 |
| Device D | 90.64 | 96.62 | 90.15 | 90.72 | N/A |
| Device E | 93.82 | 98.15 | 93.56 | 94.42 | N/A |

FIG. 4 illustrates is a flow diagram of a method 400 for training a deep learning model to characterize degradation pattern of battery capacity for a plurality of battery charging modes, in accordance with the presently disclosed embodiments. The method 400 may be performed utilizing one or more processing devices (e.g., a personal electronic device 102) that may include hardware (e.g., a general purpose processor, a battery health analyzer, a graphic processing unit (GPU), an application-specific integrated circuit (ASIC), a system-on-chip (SoC), a microcontroller, a field-programmable gate array (FPGA), a central processing unit (CPU), an application processor (AP), a visual processing unit (VPU), a neural processing unit (NPU), a neural decision processor (NDP), or any other processing device(s) that may be suitable for processing 2D and 3D image data, software (e.g., instructions running/executing on one or more processors), firmware (e.g., microcode), or some combination thereof.

The method 400 may begin at step 410 with the one or more processing devices (e.g., a personal electronic device 102), where the personal electronic device 102 may access, from a remote server, a general battery-health model corresponding to the personal electronic device 102. As an example and not by way of limitation, in particular embodiments, the personal electronic device 102 may assess a global DNN model exported from cloud. At step 420, the personal electronic device 102 may access real-time battery charging data from the personal electronic device 102 for a plurality of battery charging modes. In particular embodiments, the plurality of battery charging modes includes a fast battery charging mode and a slow battery charging mode. At step 430, the personal electronic device 102 may identify a plurality of data subgroups of battery charging data based on the real-time battery charging data. Because different battery charging modes can lead to different feature values corresponding to the same SoH value, the personal electronic device 102 may carry balanced weights between the data subgroups of battery charging data into training. At step 440, the personal electronic device 102 may train a customized battery-health model to characterize degradation pattern of battery capacity using the general battery-health model as a starting model in a cascaded workflow. In particular embodiments, the personal electronic device 102 may firstly update the customized battery-health model using a first cycle data, such as a subgroup of battery slow charging data, then served as transferred knowledge for next training using a second cycle data, such as a subgroup of battery fast charging data, and so on. At step 450, the personal electronic device 102 may determine, using the customized battery-health model, a plurality of first state-of-health values associated with the personal electronic device 102 for the plurality of battery charging modes, respectively, based on real-time battery output capacity, real-time battery output voltage, and real-time battery output current. Particular embodiments may repeat one or more steps of the method of FIG. 4, where appropriate. Although this disclosure describes and illustrates particular steps of the method of FIG. 4 as occurring in a particular order, this disclosure contemplates any suitable steps of the method of FIG. 4 occurring in any suitable order. Moreover, although this disclosure describes and illustrates an example method for automatic SoH estimation including the particular steps of the method of FIG. 4, this disclosure contemplates any suitable method for automatic SoH estimation including any suitable steps, which may include all, some, or none of the steps of the method of FIG. 4, where appropriate. Furthermore, although this disclosure describes and illustrates particular components, devices, or systems carrying out particular steps of the method of FIG. 4, this disclosure contemplates any suitable combination of any suitable components, devices, or systems carrying out any suitable steps of the method of FIG. 4.

AI Architecture

Figure 5:
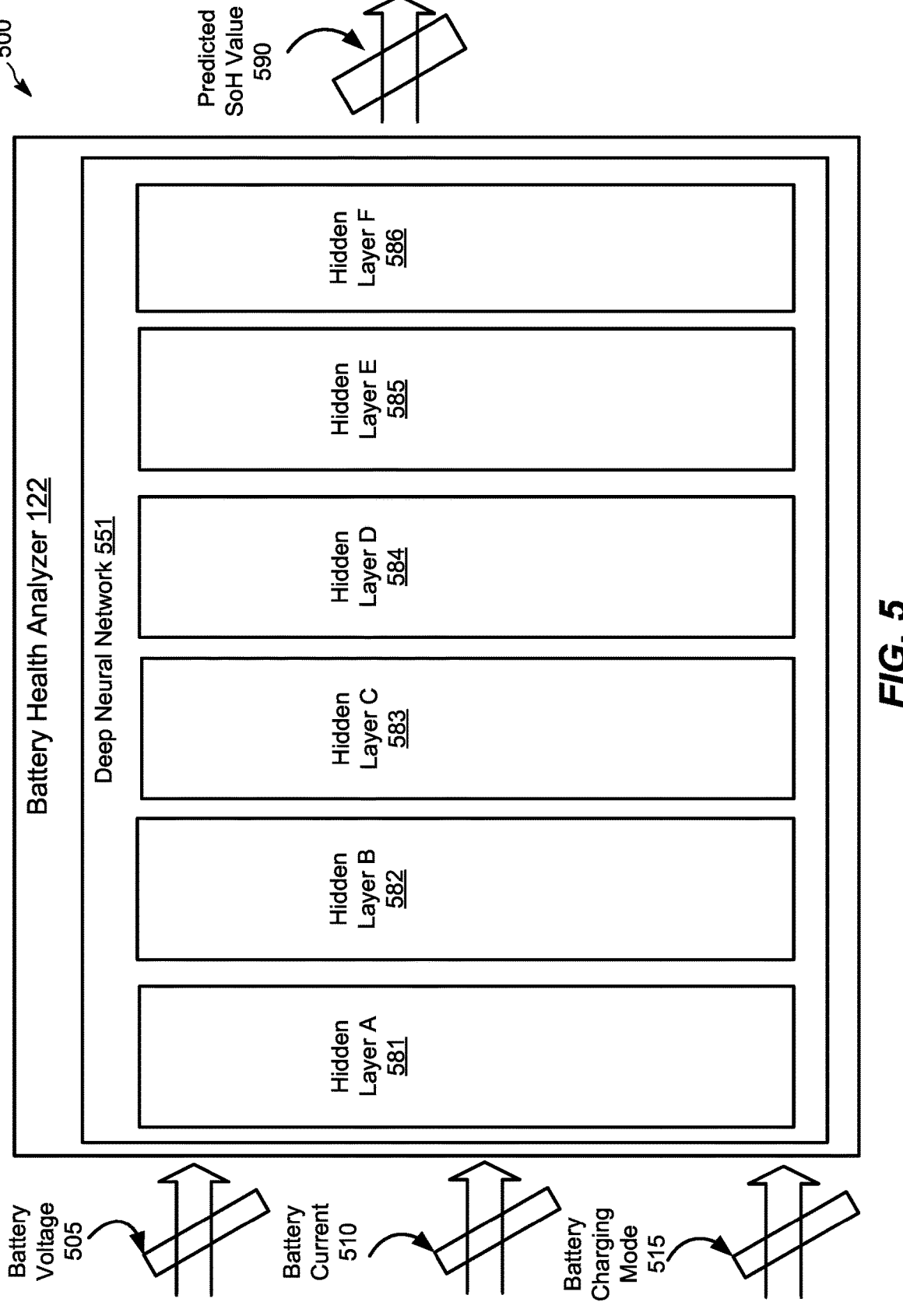
FIG. 5 illustrates a diagram of an example machine learning algorithm that may be utilized to perform automatic SoH estimation for a plurality of battery charging modes.

FIG. 5 illustrates a diagram of an example machine learning algorithm 500 that may be utilized to perform automatic SoH estimation for a plurality of battery charging modes, in accordance with the presently disclosed embodiments. In particular embodiments, the machine learning algorithm 500 may be implemented utilizing, as example and not by way of limitation, one or more processing devices that may include hardware (e.g., a general purpose processor, a graphic processing unit (GPU), an application-specific integrated circuit (ASIC), a system-on-chip (SoC), a microcontroller, a field-programmable gate array (FPGA), a central processing unit (CPU), an application processor (AP), a visual processing unit (VPU), a neural processing unit (NPU), a neural decision processor (NDP), and/or other processing device(s) that may be suitable for processing various data and making one or more decisions based thereon), software (e.g., instructions running/executing on one or more processing devices), firmware (e.g., microcode), or some combination thereof.

In FIG. 5, the battery health analyzer 122 is programmed to train one or more customized battery-health models 214 using a deep neural network 551 for predicting SoH values 590. The deep neural network 551 may include as a feed-forward neural network, a convolutional neural network. and a long short-term memory. The input parameters may include battery voltage 505, battery current 510, and battery charging mode 515. The deep neural network 551 may include six hidden layers, such as hidden layer A 581, hidden layer B 582, hidden layer C 583, hidden layer D 584, hidden layer E 585, hidden layer F 586, which may be a convolutional layer, a pooling layer, a rectified linear unit (ReLU) layer, a softmax layer, a regressor layer, a dropout layer, and/or various other hidden layer types. In particular embodiments, the number of hidden layers may be greater than or less than six. These hidden layers can be arranged in any order as long as they satisfy the input/output size criteria. Each layer comprises of a set number of image filters. The output of filters from each layer is stacked together in the third dimension. This filter response stack then serves as the input to the next layer(s). Each hidden layer may be featured by 20 neurons or any appropriate number of neurons.

In particular embodiments, the hidden layers are configured as follows. The hidden layer A 581 and the hidden layer B 582 may be down-sampling blocks to extract high-level features from the input data set. The hidden layer D 584 and the hidden layer E 585 may be up-sampling blocks to output the classified or predicted output data set. The hidden layer C 583 may perform residual stacking as bottleneck between down-sampling blocks (e.g., hidden layer A 581, hidden layer B 582) and up-sampling blocks (e.g., hidden layer D 584, hidden layer E 585). The hidden layer F 586 may include a softmax layer or a regressor layer to classify or predict a predetermined class or a value based on input attributes.

In a convolutional layer, the input data set is convolved with a set of learned filters that are designed to highlight specific characteristics of the input data set. A pooling layer produces a scaled down version of the output by considering small neighborhood regions and applying a desired operation filter (e.g. min, max, mean, etc.) across the neighborhood. A ReLU layer enhances a nonlinear property of the network by introducing a non-saturating activation function. One example of such a non-saturating function is to threshold out negative responses (i.e., set negative values to zero). A fully connected layer provides a high-level reasoning by connecting each node in the layer to all activation nodes in the previous layer. A softmax layer maps the inputs from previous layer into a value between 0 and 1 or between −1 and 1. Therefore, a softmax layer allows for interpreting the outputs as probabilities and selection of classified facie with highest probability. In particular embodiments, a softmax layer may apply a symmetric sigmoid transfer function to each element of the raw outputs independently to interpret the outputs as probabilities in the range of values between −1 and 1. A dropout layer offers a regularization technique for reducing network over-fitting on the training data by dropping out individual nodes with a certain probability. A loss layer (e.g., utilized in training) defines a weight dependent cost function that needs to be optimized (i.e., bring the cost down toward zero) for improved accuracy. In particular embodiments, each hidden layer is a combination of a convolutional layer, a pooling layer, and a ReLU layer in a multilayer architecture. As example and not by way of limitation. each hidden has a convolutional layer, a pooling layer, and a ReLU layer.

In particular embodiments, the deep neural network 551 may include an activation function in a ReLU layer (e.g., hidden layer F 586) to calculate the misfit function based on the difference between the predicted SoH value and a ground truth (e.g., real-time SoH value obtained from the electronic device). In particular embodiments, the deep neural network 551 may use a simple data split technique to separate the input data, such as battery voltage 505, battery current 510, and battery charging mode 515, used for the training, validation, and testing of the physics constrained machine learning models. As example and not by way of limitation, the data split technique may consider 70% of the input data for model training (e.g., tuning of the model parameters), 15% of the obtained input data for validation (e.g., performance validation for each different set of model parameters), and 15% of the obtained input data for testing the final trained model. However, the data split technique may be appropriately adjusted (e.g., by the user) to prevent over-fitting that results in the deep neural network 551 with limited generalization capabilities (e.g., models that under-perform when predicting unseen sample data).

Furthermore, the deep neural network 551 may apply a nested k-fold inner/outer cross-validation to tune and validate the optimal parameters of the model. In one or more embodiments, the nested stratified inner/outer cross-validation may be a software and/or hardware system that includes functionality to mitigate the over-fitting problem of the model by applying a k-fold inner cross-validation and a k-fold outer cross-validation. The k-fold inner cross-validation and the k-fold outer cross-validation may have different values of the "k" parameter. In some example embodiments, the nested inner/outer cross-validation defines one or more physics constrained machine learning algorithms and their corresponding models in a grid and evaluates one or more performance metrics of interest (e.g., area under curve (AUC), accuracy, geometric mean, f1 score, mean absolute error, mean squared error, sensitivity, specificity, etc.) to find the optimal parameters of the deep neural network 551.

Figure 6:
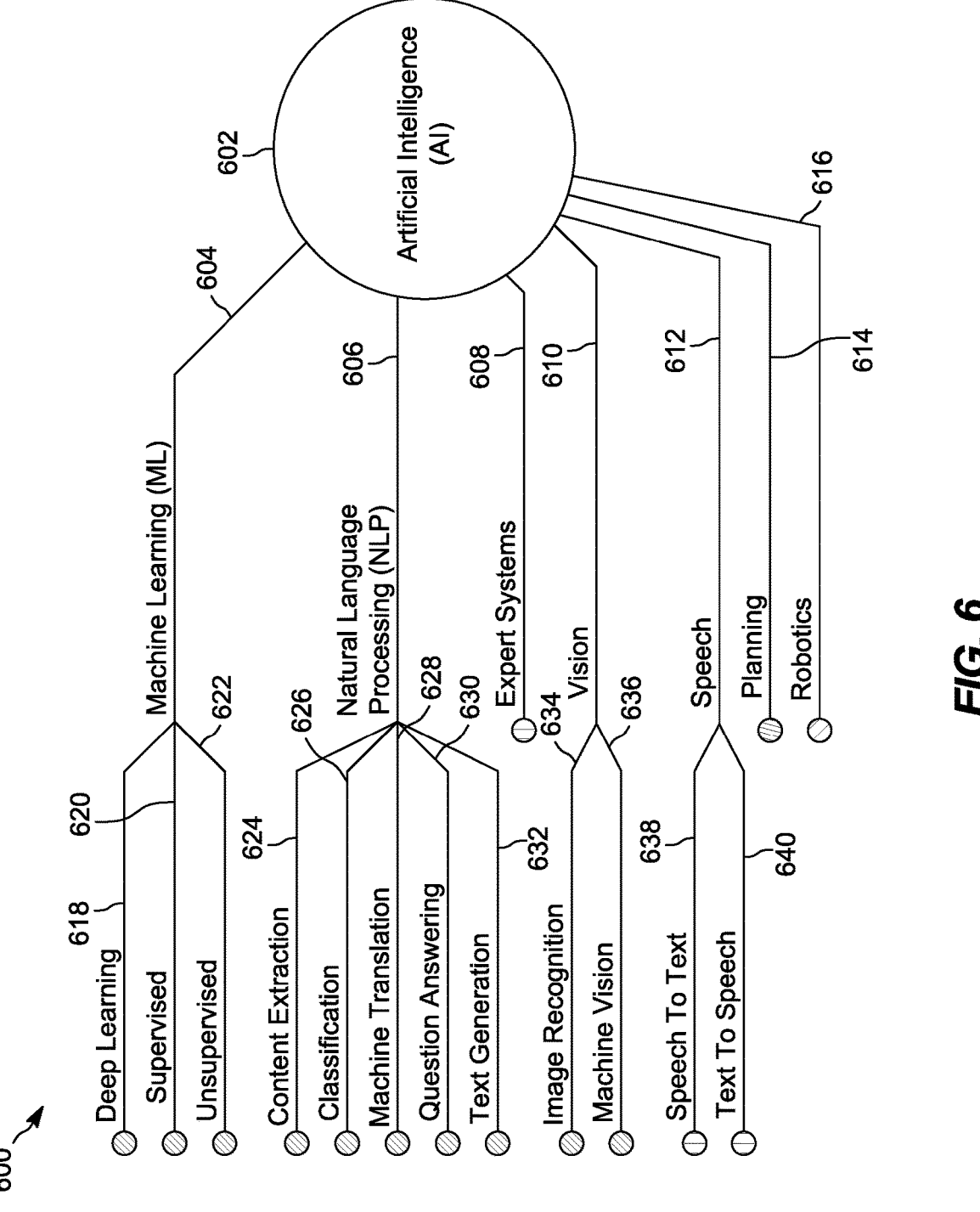
FIG. 6 illustrates a diagram of an example artificial intelligence (AI) architecture.

FIG. 6 illustrates a diagram 600 of an example artificial intelligence (AI) architecture 602 that may be utilized to perform automatic SoH estimation using one or more components of an electronic device, in accordance with the presently disclosed embodiments. In particular embodiments, the AI architecture 602 may be implemented utilizing, for example, one or more processing devices that may include hardware (e.g., a general purpose processor, a graphic processing unit (GPU), an application-specific integrated circuit (ASIC), a system-on-chip (SoC), a microcontroller, a field-programmable gate array (FPGA), a central processing unit (CPU), an application processor (AP), a visual processing unit (VPU), a neural processing unit (NPU), a neural decision processor (NDP), and/or other processing device(s) that may be suitable for processing various data and making one or more decisions based thereon), software (e.g., instructions running/executing on one or more processing devices), firmware (e.g., microcode), or some combination thereof.

In particular embodiments, as depicted by FIG. 6, the AI architecture 602 may include machine leaning (ML) algorithms and functions 604, natural language processing (NLP) algorithms and functions 606, expert systems 608, computer-based vision algorithms and functions 610, speech recognition algorithms and functions 612, planning algorithms and functions 614, and robotics algorithms and functions 616. In particular embodiments, the ML algorithms and functions 604 may include any statistics-based algorithms that may be suitable for finding patterns across large amounts of data (e.g., "Big Data" such as user click data or other user interactions, text data, image data, video data, audio data, speech data, numbers data, and so forth). For example, in particular embodiments, the ML algorithms and functions 604 may include deep learning algorithms 618, supervised learning algorithms 620, and unsupervised learning algorithms 622.

In particular embodiments, the deep learning algorithms 618 may include any artificial neural networks (ANNs) that may be utilized to learn deep levels of representations and abstractions from large amounts of data. For example, the deep learning algorithms 618 may include ANNs, such as a multilayer perceptron (MLP), an autoencoder (AE), a convolutional neural network (CNN), a recurrent neural network (RNN), long short term memory (LSTM), a grated recurrent unit (GRU), a restricted Boltzmann Machine (RBM), a deep belief network (DBN), a bidirectional recurrent deep neural network (BRDNN), a generative adversarial network (GAN), and deep Q-networks, a neural autoregressive distribution estimation (NADE), an adversarial network (AN), attentional models (AM), deep reinforcement learning, and so forth.

In particular embodiments, the supervised learning algorithms 620 may include any algorithms that may be utilized to apply, for example, what has been learned in the past to new data using labeled examples for predicting future events. For example, starting from the analysis of a known training dataset, the supervised learning algorithms 620 may produce an inferred function to make predictions about the output values. The supervised learning algorithms 620 can also compare its output with the correct and intended output and find errors in order to modify the supervised learning algorithms 620 accordingly. On the other hand, the unsupervised learning algorithms 622 may include any algorithms that may applied, for example, when the data used to train the unsupervised learning algorithms 622 are neither classified or labeled. For example, the unsupervised learning algorithms 622 may study and analyze how systems may infer a function to describe a hidden structure from unlabeled data.

In particular embodiments, the NLP algorithms and functions 606 may include any algorithms or functions that may be suitable for automatically manipulating natural language, such as speech and/or text. For example, in particular embodiments, the NLP algorithms and functions 606 may include content extraction algorithms or functions 624, classification algorithms or functions 626, machine translation algorithms or functions 628, question answering (QA) algorithms or functions 630, and text generation algorithms or functions 632. In particular embodiments, the content extraction algorithms or functions 624 may include a means for extracting text or images from electronic documents (e.g., webpages, text editor documents, and so forth) to be utilized, for example, in other applications.

In particular embodiments, the classification algorithms or functions 626 may include any algorithms that may utilize a supervised learning model (e.g., logistic regression, naïve Bayes, stochastic gradient descent (SGD), k-nearest neighbors, decision trees, random forests, support vector machine (SVM), and so forth) to learn from the data input to the supervised learning model and to make new observations or classifications based thereon. The machine translation algorithms or functions 628 may include any algorithms or functions that may be suitable for automatically converting source text in one language, for example, into text in another language. The QA algorithms or functions 630 may include any algorithms or functions that may be suitable for automatically answering questions posed by humans in, for example, a natural language, such as that performed by voice-controlled personal assistant devices. The text generation algorithms or functions 632 may include any algorithms or functions that may be suitable for automatically generating natural language texts.

In particular embodiments, the expert systems 608 may include any algorithms or functions that may be suitable for simulating the judgment and behavior of a human or an organization that has expert knowledge and experience in a particular field (e.g., stock trading, medicine, sports statistics, and so forth). The computer-based vision algorithms and functions 610 may include any algorithms or functions that may be suitable for automatically extracting information from images (e.g., photo images, video images). For example, the computer-based vision algorithms and functions 610 may include image recognition algorithms 634 and machine vision algorithms 636. The image recognition algorithms 634 may include any algorithms that may be suitable for automatically identifying and/or classifying objects, places, people, and so forth that may be included in, for example, one or more image frames or other displayed data. The machine vision algorithms 636 may include any algorithms that may be suitable for allowing computers to "see", or, for example, to rely on image sensors cameras with specialized optics to acquire images for processing, analyzing, and/or measuring various data characteristics for decision making purposes.

In particular embodiments, the speech recognition algorithms and functions 612 may include any algorithms or functions that may be suitable for recognizing and translating spoken language into text 638 or text into spoken language 640, such as through automatic speech recognition (ASR), computer speech recognition, speech-to-text (STT), or text-to-speech (TTS) in order for the computing to communicate via speech with one or more users, for example. In particular embodiments, the planning algorithms and functions 614 may include any algorithms or functions that may be suitable for generating a sequence of actions, in which each action may include its own set of preconditions to be satisfied before performing the action. Examples of AI planning may include classical planning, reduction to other problems, temporal planning, probabilistic planning, preference-based planning, conditional planning, and so forth. Lastly, the robotics algorithms and functions 616 may include any algorithms, functions, or systems that may enable one or more devices to replicate human behavior through, for example, motions, gestures, performance tasks, decision-making, emotions, and so forth.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Systems and Methods

Figure 7:
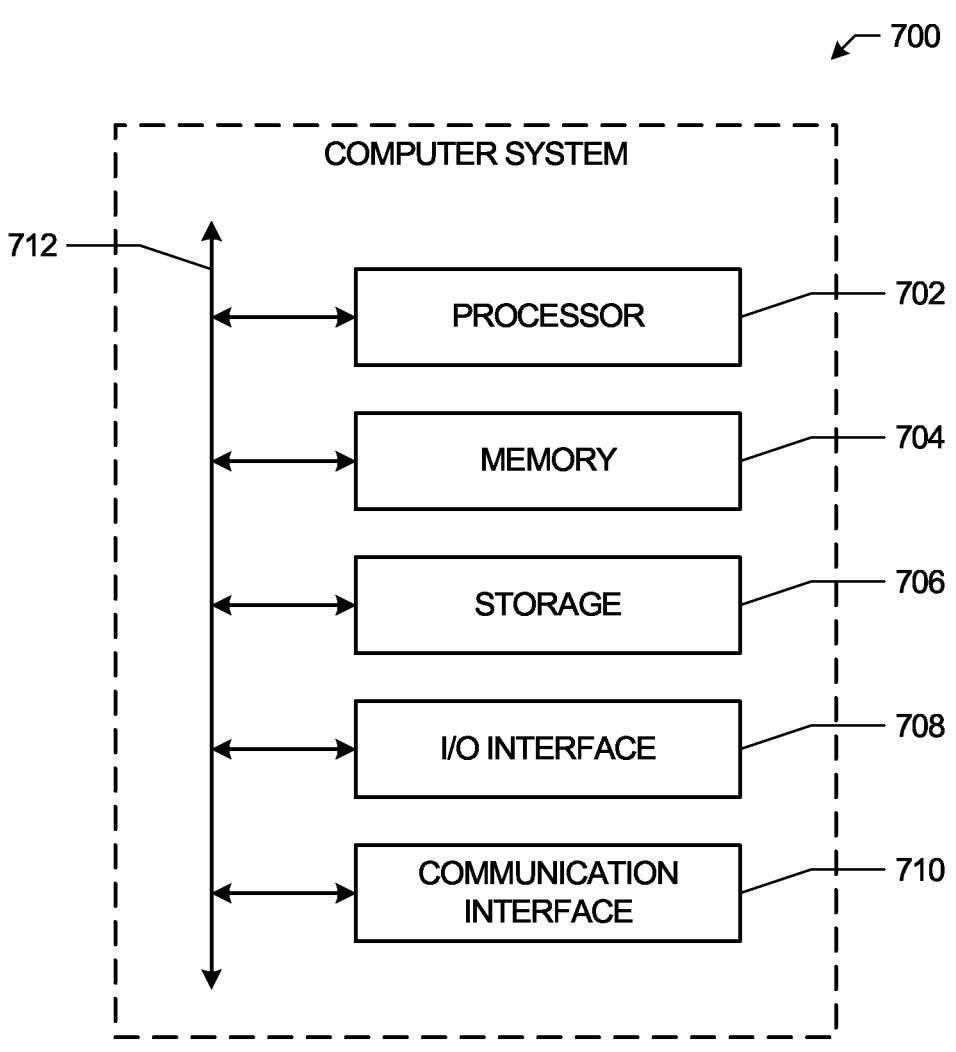
FIG. 7 illustrates an example computer system.

FIG. 7 illustrates an example computer system 700 that may be utilized to perform on-device training for the electronic device 100, in accordance with the presently disclosed embodiments. In particular embodiments, one or more computer systems 700 perform one or more steps of one or more methods described or illustrated herein. In particular embodiments, one or more computer systems 700 provide functionality described or illustrated herein. In particular embodiments, software running on one or more computer systems 700 performs one or more steps of one or more methods described or illustrated herein or provides functionality described or illustrated herein. Particular embodiments include one or more portions of one or more computer systems 700. Herein, reference to a computer system may encompass a computing device, and vice versa, where appropriate. Moreover, reference to a computer system may encompass one or more computer systems, where appropriate.

This disclosure contemplates any suitable number of computer systems 700. This disclosure contemplates computer system 700 taking any suitable physical form. As example and not by way of limitation, computer system 700 may be an embedded computer system, a system-on-chip (SOC), a single-board computer system (SBC) (e.g., a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, computer system 700 may include one or more computer systems 700; be unitary or distributed; span multiple locations; span multiple machines; span multiple data centers; or reside in a cloud, which may include one or more cloud components in one or more networks.

Where appropriate, one or more computer systems 700 may perform without substantial spatial or temporal limitation one or more steps of one or more methods described or illustrated herein. As an example, and not by way of limitation, one or more computer systems 700 may perform in real time or in batch mode one or more steps of one or more methods described or illustrated herein. One or more computer systems 700 may perform at different times or at different locations one or more steps of one or more methods described or illustrated herein, where appropriate.

In particular embodiments, computer system 700 includes a processor 702, memory 704, storage 706, an input/output (I/O) interface 708, a communication interface 710, and a bus 712. Although this disclosure describes and illustrates a particular computer system having a particular number of particular components in a particular arrangement, this disclosure contemplates any suitable computer system having any suitable number of any suitable components in any suitable arrangement. In particular embodiments, processor 702 includes hardware for executing instructions, such as those making up a computer program. As an example, and not by way of limitation, to execute instructions, processor 702 may retrieve (or fetch) the instructions from an internal register, an internal cache, memory 704, or storage 706; decode and execute them; and then write one or more results to an internal register, an internal cache, memory 704, or storage 706. In particular embodiments, processor 702 may include one or more internal caches for data, instructions, or addresses. This disclosure contemplates processor 702 including any suitable number of any suitable internal caches, where appropriate. As an example, and not by way of limitation, processor 702 may include one or more instruction caches, one or more data caches, and one or more translation lookaside buffers (TLBs). Instructions in the instruction caches may be copies of instructions in memory 704 or storage 706, and the instruction caches may speed up retrieval of those instructions by processor 702.

Data in the data caches may be copies of data in memory 704 or storage 706 for instructions executing at processor 702 to operate on; the results of previous instructions executed at processor 702 for access by subsequent instructions executing at processor 702 or for writing to memory 704 or storage 706; or other suitable data. The data caches may speed up read or write operations by processor 702. The TLBs may speed up virtual-address translation for processor 702. In particular embodiments, processor 702 may include one or more internal registers for data, instructions, or addresses. This disclosure contemplates processor 702 including any suitable number of any suitable internal registers, where appropriate. Where appropriate, processor 702 may include one or more arithmetic logic units (ALUs); be a multi-core processor; or include one or more processors 702. Although this disclosure describes and illustrates a particular processor, this disclosure contemplates any suitable processor.

In particular embodiments, memory 704 includes main memory for storing instructions for processor 702 to execute or data for processor 702 to operate on. As an example, and not by way of limitation, computer system 700 may load instructions from storage 706 or another source (such as, for example, another computer system 700) to memory 704. Processor 702 may then load the instructions from memory 704 to an internal register or internal cache. To execute the instructions, processor 702 may retrieve the instructions from the internal register or internal cache and decode them. During or after execution of the instructions, processor 702 may write one or more results (which may be intermediate or final results) to the internal register or internal cache. Processor 702 may then write one or more of those results to memory 704. In particular embodiments, processor 702 executes only instructions in one or more internal registers or internal caches or in memory 704 (as opposed to storage 706 or elsewhere) and operates only on data in one or more internal registers or internal caches or in memory 704 (as opposed to storage 706 or elsewhere).

One or more memory buses (which may each include an address bus and a data bus) may couple processor 702 to memory 704. Bus 712 may include one or more memory buses, as described below. In particular embodiments, one or more memory management units (MMUs) reside between processor 702 and memory 704 and facilitate accesses to memory 704 requested by processor 702. In particular embodiments, memory 704 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 704 may include one or more memory devices 704, where appropriate. Although this disclosure describes and illustrates particular memory, this disclosure contemplates any suitable memory.

In particular embodiments, storage 706 includes mass storage for data or instructions. As an example, and not by way of limitation, storage 706 may include a hard disk drive (HDD), a floppy disk drive, flash memory, an optical disc, a magneto-optical disc, magnetic tape, or a Universal Serial Bus (USB) drive or a combination of two or more of these. Storage 706 may include removable or non-removable (or fixed) media, where appropriate. Storage 706 may be internal or external to computer system 700, where appropriate. In particular embodiments, storage 706 is non-volatile, solid-state memory. In particular embodiments, storage 706 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 706 taking any suitable physical form. Storage 706 may include one or more storage control units facilitating communication between processor 702 and storage 706, where appropriate. Where appropriate, storage 706 may include one or more storages 706. Although this disclosure describes and illustrates particular storage, this disclosure contemplates any suitable storage.

In particular embodiments, I/O interface 708 includes hardware, software, or both, providing one or more interfaces for communication between computer system 700 and one or more I/O devices. Computer system 700 may include one or more of these I/O devices, where appropriate. One or more of these I/O devices may enable communication between a person and computer system 700. As an example, and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 706 for them. Where appropriate, I/O interface 708 may include one or more device or software drivers enabling processor 702 to drive one or more of these I/O devices. I/O interface 708 may include one or more I/O interfaces 706, where appropriate. Although this disclosure describes and illustrates a particular I/O interface, this disclosure contemplates any suitable I/O interface.

In particular embodiments, communication interface 710 includes hardware, software, or both providing one or more interfaces for communication (such as, for example, packet-based communication) between computer system 700 and one or more other computer systems 700 or one or more networks. As an example, and not by way of limitation, communication interface 710 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 710 for it.

As an example and not by way of limitation, computer system 700 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 700 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 700 may include any suitable communication interface 710 for any of these networks, where appropriate. Communication interface 710 may include one or more communication interfaces 710, where appropriate. Although this disclosure describes and illustrates a particular communication interface, this disclosure contemplates any suitable communication interface.

In particular embodiments, bus 712 includes hardware, software, or both coupling components of computer system 700 to each other. As an example, and not by way of limitation, bus 712 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 712 may include one or more buses 712, where appropriate. Although this disclosure describes and illustrates a particular bus, this disclosure contemplates any suitable bus or interconnect.

Miscellaneous

Herein, "or" is inclusive and not exclusive, unless expressly indicated otherwise or indicated otherwise by context. Therefore, herein, "A or B" means "A, B, or both,"

unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

Herein, "automatically" and its derivatives means "without human intervention," unless expressly indicated otherwise or indicated otherwise by context.

The embodiments disclosed herein are only examples, and the scope of this disclosure is not limited to them. Embodiments according to the invention are in particular disclosed in the attached claims directed to a method, a storage medium, a system and a computer program product, wherein any feature mentioned in one claim category, e.g. method, can be claimed in another claim category, e.g. system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A method for operating a battery management system of a mobile electronic device, comprising:

accessing, from a remote server, a general battery-health model corresponding to the mobile electronic device, wherein the general battery-health model is a first deep neural network trained to calculate a state-of-health value for a battery of the mobile electronic device based on historic battery output capacity, historic battery output voltage, and historic battery output current associated with the mobile electronic device;

accessing first real-time battery charging data from the mobile electronic device for a plurality of battery charging modes, wherein the first real-time battery charging data comprises battery input voltage and battery input current during each of the plurality of battery charging modes;

identifying a plurality of data subgroups of battery charging data based on the first real-time battery charging data, wherein each data subgroup is associated with one of the battery charging modes;

receiving power from a power source electrically coupled to the battery of the mobile electronic device and being configured to charge the battery of the mobile electronic device; and in response to the battery of the mobile electronic device achieving a maximum charge:

training, using the general battery-health model as a starting model, a first customized battery-health model in a cascaded workflow using each of the plurality of data subgroups of battery charging data for the plurality of battery charging modes, wherein the first customized battery-health model is a second deep neural network trained to calculate state-of-health values associated with the battery of the mobile electronic device for the plurality of battery charging modes, respectively;

generating, using the first customized battery-health model, a plurality of first state-of-health values associated with the battery of the mobile electronic device for the plurality of battery charging modes, respectively, based on real-time battery output capacity, real-time battery output voltage, and real-time battery output current, wherein the generated plurality of first state-of-health values enable the battery management system to prolong a battery life of the battery of the mobile electronic device; and alleviating a potential unexpected deactivation of the mobile electronic device based at least in part on the generated plurality of first state-of-health values.

2. The method of claim 1, further comprising:

determining a safety risk associated with the mobile electronic device based on the plurality of first state-of-health values associated with the plurality of battery charging modes; and presenting, by the mobile electronic device, an indication of the determined safety risk and the plurality of first state-of-health values associated with the mobile electronic device for the plurality of battery charging modes.

3. The method of claim 2, further comprising:

generating a work order of maintenance based on the safety risk associated with the mobile electronic device and the plurality of first state-of-health values associated with the mobile electronic device for the plurality of battery charging modes; and sending, to the remote server, the work order of maintenance for the mobile electronic device.

4. The method of claim 1, further comprising, by the remote server:

accessing the historic battery output capacity, historic battery output voltage, and historic output current associated with the mobile electronic device;

training the general battery-health model based on the historic battery output capacity, historic battery output voltage, and historic battery output current associated with the mobile electronic device; and sending, from the remote server to the mobile electronic device, the general battery-health model via a wireless network.

5. The method of claim 1, further comprising:

accessing second real-time battery charging data from the mobile electronic device from a latest charging cycle; wherein the second real-time battery charging data comprises battery input voltage and battery input current during each of the plurality of battery charging modes from the latest charging cycle;

training, using the first customized battery-health model as a starting model, a second customized battery-health model using the second real-time battery charging data from the mobile electronic device from the latest charging cycle; and determining, using the second customized battery-health model, a plurality of second state-of-health values associated with the mobile electronic device for the plurality of battery charging modes, respectively, based on the real-time battery output capacity, the real-time battery output voltage, and the real-time battery output current.

6. The method of claim 1, wherein the plurality of battery charging modes includes a fast charging mode and a slow charging mode, and wherein the general battery-health model and customized battery-health model are based on a lithium-ion battery associated with the mobile electronic device.

7. The method of claim 6, wherein the real-time battery charging data has a first sampling rate of the fast charging mode and a second sampling rate of the slow charging mode, wherein the first sampling rate is at a higher frequency than the second sampling rate, and wherein the method further comprises:

applying over-sampling to the real-time battery charging data for the slow charging mode to match a sampling rate of the battery charging data for the fast charging mode.

8. The method of claim 6, wherein the real-time battery charging data has a first sampling rate of the slow charging mode and a second sampling rate of the fast charging mode, wherein the first sampling rate is at a higher frequency than the second sampling rate, and wherein the method further comprises:

applying over-sampling to the real-time battery charging data for the fast charging mode to match a sampling rate of the battery charging data for the slow charging mode.

9. A mobile electronic device, comprising:

one or more displays;

one or more non-transitory computer-readable storage media including instructions; and one or more processors coupled to the storage media, the one or more processors configured to execute the instructions to:

access, from a remote server, a general battery-health model corresponding to the mobile electronic device, wherein the general battery-health model is a first deep neural network trained to calculate a state-of-health value for a battery of the mobile electronic device based on historic battery output capacity, historic battery output voltage, and historic battery output current associated with the mobile electronic device;

access first real-time battery charging data from the mobile electronic device for a plurality of battery charging modes, wherein the first real-time battery charging data comprises battery input voltage and battery input current during each of the plurality of battery charging modes;

identify a plurality of data subgroups of battery charging data based on the first real-time battery charging data, wherein each data subgroup is associated with one of the battery charging modes;

receive power from a power source electrically coupled to the battery of the mobile electronic device and being configured to charge the battery of the mobile electronic device; and in response to the battery of the mobile electronic device achieving a maximum charge:

train, using the general battery-health model as a starting model, a first customized battery-health model in a cascaded workflow using each of the plurality of data subgroups of battery charging data for the plurality of battery charging modes, wherein the first customized battery-health model is a second deep neural network trained to calculate state-of-health values associated with the battery of the mobile electronic device for the plurality of battery charging modes, respectively;

generate, using the first customized battery-health model, a plurality of first state-of-health values associated with the battery of the mobile electronic device for the plurality of battery charging modes, respectively, based on real-time battery output capacity, real-time battery output voltage, and real-time battery output current, wherein the generated plurality of first state-of-health values enable a battery management system of the mobile electronic device to prolong a battery life of the battery of the mobile electronic device; and alleviate a potential unexpected deactivation of the mobile electronic device based at least in part on the generated plurality of first state-of-health values.

10. The mobile electronic device of claim 9, wherein the processors are further configured to execute the instructions to:

determine a safety risk associated with the mobile electronic device based on the plurality of first state-of-health values associated with the plurality of battery charging modes; and present, by the mobile electronic device, an indication of the determined safety risk and the plurality of first state-of-health values associated with the mobile electronic device for the plurality of battery charging modes.

11. The mobile electronic device of claim 10, wherein the processors are further configured to execute the instructions to:

generate a work order of maintenance based on the safety risk associated with the mobile electronic device and the plurality of first state-of-health values associated with the mobile electronic device for the plurality of battery charging modes; and send, to the remote server, the work order of maintenance for the mobile electronic device.

12. The mobile electronic device of claim 9, wherein the processors are further configured to execute the instructions to:

access the historic battery output capacity, historic battery output voltage, and historic output current associated with the mobile electronic device;

train the general battery-health model based on the historic battery output capacity, historic battery output voltage and historic battery output current associated with the mobile electronic device; and send, from the remote server to the mobile electronic device, the general battery-health model via a wireless network.

13. The mobile electronic device of claim 9, wherein the processors are further configured to execute the instructions to:

access second real-time battery charging data from the mobile electronic device from a latest charging cycle; wherein the second real-time battery charging data comprises battery input voltage and battery input current during each of the plurality of battery charging modes from the latest charging cycle;

train, using the first customized battery-health model as a starting model, a second customized battery-health model using the second real-time battery charging data from the mobile electronic device from the latest charging cycle; and determine, using the second customized battery-health model, a plurality of second state-of-health values associated with the mobile electronic device for the plurality of battery charging modes, respectively, based on the real-time battery output capacity, the real-time battery output voltage, and the real-time battery output current.

14. The mobile electronic device of claim 9, wherein the plurality of battery charging modes includes a fast charging mode and a slow charging mode, and wherein the general battery-health model and customized battery-health model are based on a lithium-ion battery associated with the mobile electronic device.

15. The mobile electronic device of claim 14, wherein the real-time battery charging data has a first sampling rate of the fast charging mode and a second sampling rate of the slow charging mode, wherein the first sampling rate is at a higher frequency than the second sampling rate, and wherein the processors are further configured to execute the instructions to:

apply over-sampling to the real-time battery charging data for the slow charging mode to match a sampling rate of the battery charging data for the fast charging mode.

16. The mobile electronic device of claim 14, wherein the real-time battery charging data has a first sampling rate of the slow charging mode and a second sampling rate of the fast charging mode, wherein the first sampling rate is at a higher frequency than the second sampling rate, and wherein the processors are further configured to execute the instructions to:

apply over-sampling to the real-time battery charging data for the fast charging mode to match a sampling rate of the battery charging data for the slow charging mode.

17. A computer-readable non-transitory storage media comprising instructions executable by a processor to:

access, from a remote server, a general battery-health model corresponding to a mobile electronic device, wherein the general battery-health model is a first deep neural network trained to calculate a state-of-health value for a battery of the mobile electronic device based on historic battery output capacity, historic battery output voltage, and historic battery output current associated with the mobile electronic device;

access real-time battery charging data from the mobile electronic device for a plurality of battery charging modes, wherein the real-time battery charging data comprises battery input voltage and battery input current during each of the plurality of battery charging modes;

identify a plurality of data subgroups of battery charging data based on the real-time battery charging data, wherein each data subgroup is associated with one of the battery charging modes;

train, using the general battery-health model as a starting model, a first customized battery-health model in a cascaded workflow using each of the plurality of data subgroups of battery charging data for the plurality of battery charging modes, wherein the first customized battery-health model is a second deep neural network trained to calculate state-of-health values associated with the mobile electronic device for the plurality of battery charging modes, respectively; and determine, using the first customized battery-health model, a plurality of first state-of-health values associated with the mobile electronic device for the plurality of battery charging modes, respectively, based on real-time battery output capacity, real-time battery output voltage, and real-time battery output current;

access, from a remote server, a general battery-heath model corresponding to the mobile electronic device, wherein the general battery-health model is a first deep neural network trained to calculate a state-of-health value for a battery of the mobile electronic device based on historic battery output capacity, historic battery output voltage, and historic battery output current associated with the mobile electronic device;

access first real-time battery charging data from the mobile electronic device for a plurality of battery charging modes, wherein the first real-time battery charging data comprises battery input voltage and battery input current during each of the plurality of battery charging modes;

identify a plurality of data subgroups of battery charging data based on the first real-time battery charging data, wherein each data subgroup is associated with one of the battery charging modes;

receive power from a power source electrically coupled to the battery of the mobile electronic device and being configured to charge the battery of the mobile electronic device; and in response to the battery of the mobile electronic device achieving a maximum charge:

train, using the general battery-health model as a starting model, a first customized battery-health model in a cascaded workflow using each of the plurality of data subgroups of battery charging data for the plurality of battery charging modes, wherein the first customized battery-health model is a second deep neural network trained to calculate state-of-health values associated with the battery of the mobile electronic device for the plurality of battery charging modes, respectively;

generate, using the first customized battery-health model, a plurality of first state-of-health values associated with the battery of the mobile electronic device for the plurality of battery charging modes, respectively, based on real-time battery output capacity, real-time battery output voltage, and real-time battery output current, wherein the generated plurality of first state-of-health values enable a battery management system of the mobile electronic device to prolong a battery life of the battery of the mobile electronic device; and alleviate a potential unexpected deactivation of the mobile electronic device based at least in part on the generated plurality of first state-of-health values.

18. The media of claim 17, wherein the instructions are further executable by the processor to:

determine a safety risk associated with the mobile electronic device based on the plurality of first state-of-health values associated with the plurality of battery charging modes; and present, by the mobile electronic device, an indication of the determined safety risk and the plurality of first state-of-health values associated with the mobile electronic device for the plurality of battery charging modes.

19. The media of claim 18, wherein the instructions are further executable by the processor to:

generate a work order of maintenance based on the safety risk associated with the mobile electronic device and the plurality of first state-of-health values associated with the mobile electronic device for the plurality of battery charging modes; and send, to the remote server, the work order of maintenance for the mobile electronic device.

20. The media of claim 17, wherein the instructions are further executable by the processor to:

access the historic battery output capacity, historic battery output voltage, and historic output current associated with the mobile electronic device;

train the general battery-health model based on the historic battery output capacity, historic battery output voltage, and historic battery output current associated with the mobile electronic device; and send, from the remote server to the mobile electronic device, the general battery-heath model via a wireless network.

\* \* \* \* \*